United States Patent
Fjelstad et al.

(10) Patent No.: US 6,518,160 B1
(45) Date of Patent: Feb. 11, 2003

(54) METHOD OF MANUFACTURING CONNECTION COMPONENTS USING A PLASMA PATTERNED MASK

(75) Inventors: Joseph Fjelstad, Sunnyvale, CA (US); Belgacem Haba, Cupertino, CA (US); David Light, Los Gatos, CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 09/245,227

(22) Filed: Feb. 5, 1999

Related U.S. Application Data

(60) Provisional application No. 60/073,772, filed on Feb. 5, 1998.

(51) Int. Cl.[7] .............................................. H01L 21/44
(52) U.S. Cl. ..................... 438/612; 438/614; 438/611; 438/667; 438/669; 216/18
(58) Field of Search ................................. 438/108, 118, 438/119, 584, 611–614, 640, 666, 667, 670, 928, 977, 669, 671; 216/17, 18, 20

(56) References Cited

U.S. PATENT DOCUMENTS

| | | | | |
|---|---|---|---|---|
| 3,269,861 A | * | 8/1966 | Schneble, Jr. et al. | 427/97 |
| 4,343,677 A | * | 8/1982 | Kinsbron et al. | 204/192.32 |
| 4,396,458 A | * | 8/1983 | Platter et al. | 216/19 |
| 4,840,923 A | * | 6/1989 | Flagello et al. | 216/18 |
| 5,489,749 A | | 2/1996 | DiStefano et al. | 174/261 |
| 5,491,302 A | | 2/1996 | DiStefano et al. | 174/260 |
| 5,518,964 A | | 5/1996 | DiStefano et al. | 438/113 |
| 5,629,239 A | | 5/1997 | DiStefano et al. | 216/14 |
| 5,763,941 A | | 6/1998 | Fjelstad | 257/669 |
| 6,071,597 A | * | 6/2000 | Yang et al. | 428/209 |
| 6,350,387 B2 | * | 2/2002 | Caron et al. | 174/254 |
| 6,378,201 B1 | * | 4/2002 | Tsukada et al. | 174/265 |

* cited by examiner

*Primary Examiner*—Carl Whitehead, Jr.
*Assistant Examiner*—Jamie L. Brophy
(74) *Attorney, Agent, or Firm*—Lerner, David, Littenberg, Krumholz & Mentlik, LLP

(57) ABSTRACT

A connection component is made by providing an assembly comprising a base layer of a dielectric material, a metal layer overlying the base layer, and a top layer of a plasma-etchable material overlying the metal layer; forming openings in the top layer to produce a top layer mask; and forming first conductive elements from the metal layer by removing metal from regions of the metal layer aligned with the openings in the top layer mask. This method may be used to form a connection component having vias or bond windows formed therein for connection with other elements of a microelectronic device and conductive elements may be formed on either or both sides of the base layer.

36 Claims, 7 Drawing Sheets

METHOD OF MANUFACTURING CONNECTION COMPONENTS USING A PLASMA PATTERNED MASK

CROSS REFERENCE TO RELATED APPLICATIONS

This application claims benefit of U.S. Provisional Application Ser. No. 60/073,772, filed Feb. 5, 1998, the disclosure of which is hereby incorporated by reference herein.

FIELD OF THE INVENTION

The present invention relates to methods of making microelectronic devices, and to components for use in the fabrication of microelectronic devices and assemblies.

BACKGROUND OF THE INVENTION

Many microelectronic devices incorporate connection components including one or more dielectric layers having holes extending therethrough and conductive elements incorporated in the connection component. The conductive elements may extend on a surface or surfaces of the dielectric layer, line the holes, extend across the holes, or the dielectric layer may incorporate a combination of these conductive elements.

Holes in connection components may be employed to form vias, which include conductive material lining the holes to provide electrical connections from one side of the connection component to another side. Such vias may be formed in a process for making a ball grid array on the connection component. Holes may also be used to form bond windows to provide an electrical connection from one side of the element to the other. For example, in forming this type of connection, a lead on the connection component may extend from across a hole or a bond window in such connection component. If the connection component is juxtaposed with a semiconductor chip or wafer having contacts on a surface thereof, the lead may be bent downwardly toward such contacts to form an electrical interconnection. U.S. Pat. Nos. 5,489,749, 5,491,302, 5,629,239, and 5,518,964, the disclosures of which are hereby incorporated by reference herein, disclose methods for making electrical connections through a hole or bond window.

A common method of forming holes in a layer of a dielectric substrate is plasma etching. In plasma etching, the portions of the dielectric substrate which are to be removed are exposed to an oxidizing plasma. Desired portions of the dielectric substrate are protected from the plasma by a mask. Typically, the dielectric substrate is masked by a layer of conductive, metallic material. The metal mask comprises a patterned metal layer overlying the dielectric substrate and having holes at locations where holes are to be formed in the dielectric substrate.

The metal mask is typically formed using a photographically patterned mask to selectively etch the metal layer. However, there are drawbacks to the photographically patterned masks commonly used. The photographically patterned mask comprises a photosensitive material exposed to light through a mask having a pattern transparent to the light. The light sets portions of the photosensitive material so that portions may be rinsed away to leave a patterned mask on the metal layer. Typically the patterned mask made using a photosensitive material, for example, a photoimagable solder resist, has a poor thermal stability properties. A photoimageable solder resist generally must be removed from the connection component before it is incorporated into a semiconductor chip package because the resist is unable to withstand the temperature cycling that a package is expected to undergo. Photosensitive materials, furthermore are highly sensitive to contaminants. A contaminant on the material will block the light and create a defect in the patterned mask. The fine line capability for forming conductive elements depends at least in part on the lack of gradation between set photosensitive material and unset photosensitive material in the mask and the adhesion between the mask and the assembly. However, gradation and adhesion problems have been experienced in the field.

Other conductive elements in connection components are formed using photographically patterned masks. After etching to form vias, conductive material is added to the vias by forming a layer of metal within the hole and typically extending on a surface or surfaces of the dielectric substrate. The substrate may be further treated to form leads on the surface or surfaces of the dielectric substrate. Leads may be formed which extend across bond windows as discussed above. The techniques typically used to form these conductive elements also include photographically patterned masks.

Improvements addressing the problems with photographically defined masks for forming conductive elements in connection components are desirable.

SUMMARY OF THE INVENTION

The present invention addresses these needs.

A method of making a connection component in accordance with one aspect of the invention comprises providing an assembly comprising a base layer of dielectric material, a metal layer overlying the base layer, and a top coat of a plasma etchable dielectric material overlying the metal layer and using plasma and a plasma-resistant mask to form openings in the top coat to produce a top coat mask for forming conductive elements from the metal layer of the assembly. The openings in the top coat are formed by plasma etching the top coat through the plasma-resistive mask.

The method of this aspect of the invention may also comprise the step of forming first conductive elements from the metal layer by removing metal from regions of the metal layer aligned with the openings in the top coat mask. Thus, the top coat mask may be used in a subtractive process to form a connection component having first conductive elements on a surface thereof.

An alternative method includes forming conductive elements on the metal layer in an additive process by adding metal to regions of the metal layer aligned with the openings in the top coat mask. The top coat mask may then be removed and metal not aligned with the added metal may then be removed to leave the conductive elements on a surface of the connection component. The resulting connection component has a metal layer comprised of a first metal material and added metal comprised of a second metal. The first and second metals may be the same or different. Both the first and second metals may each be comprised of one or more metals. In preferred embodiments, the second metal is comprised of a metal which is more readily bondable than the first metal, is susceptible to different etchants or etching agents than the first metal material, and/or etched at a different rate than the first metal material in the same etchant. The connection components made in the subtractive process, the additive process or a combinations of such processes may be used as circuit boards, connection components for semiconductor chip assemblies, connection components for semiconductor wafer assemblies, components in a multilayer microelectronic structure or other structures including metallic elements.

In another embodiment of the method of the present invention, the first conductive elements may be used as a metal mask. The method of this embodiment may also comprise the step of forming holes in the base layer using the metal mask. For example, after the subtractive process described above, the top coat mask is allowed to remain on the assembly to define conductive elements later in the method. Another mask is applied to the top coat mask, the other mask having openings aligned with the openings in the top coat mask, holes are formed in the base layer, and the other mask is removed. If vias are to be formed, the other mask preferably has openings slightly larger than the openings in the top coat mask and the base layer is plasma etched. When the base layer is etched to form the holes, the top coat mask is also partially etched to expose regions on the first conductive elements. These regions will define a pad surrounding the via on the top surface of the base layer. The top coat mask remains on the assembly to define areas on which the second conductive elements will be formed. The second conductive elements may be formed by adding a layer of a first metal on the regions and, if vias are to be formed, the second conductive elements may be formed so that they extend into the one or more holes to line the holes. If the one or more holes comprise bonding windows, subsequent steps may be performed to form one or more leads extending across the one or more holes.

The method also preferably includes adding a second metal to the first metal of the second conductive elements. The second metal may comprise a metal which is more readily bondable then the first metal or which is susceptible to different etchants or etching agents. After the second metal has been added, the top coat mask is then removed and portions of the first conductive elements which were covered by the top coat mask are removed. The regions of the first conductive elements on which the second conductive elements were formed remain as part of the connection component. Further steps may be carried out to incorporate the connection component in an electronic device or some other assembly including metallic elements.

Another aspect of the invention includes making a connection component having conductive elements formed on both sides of the element. An assembly is provided, comprising a base layer of a dielectric material having a top surface and the bottom surface, a top metal layer on the top surface, a bottom metal layer on the bottom surface, a first top coat of a plasma-etchable dielectric material on the top metal layer, and a second top coat of dielectric material on the bottom metal layer, and using a mask to form openings in the first and second top coats to produce a first and second top coat mask for forming conductive elements from the top and bottom metal layers of the assembly. The mask may comprise a plasma-resistive mask and the first and second top coat masks may be formed by plasma etching the first and second top coats.

The first and second top coat masks may be used to form conductive elements such as a top and bottom metal mask. These masks are formed from the top and bottom metal layers by removing metal from the top and bottom metal layers and forming holes in the base layer using the metal masks. The holes may later be used as bond windows or to form vias or other features, as discussed above.

An asymmetrical connection component having different conductive elements on top and bottom sides of the element may be made. The first top coat mask may be used to form a metal mask from the top metal layer by removing metal from the top metal layer, using another mask to form holes in the base layer, and removing the other mask. If vias are to be formed, dielectric material may also be removed from the first top coat mask to define areas on which pads will be formed during the hole forming step. The top coat mask may be used to form top conductive elements by adding a first metal to the assembly. To protect the bottom metal layer while forming the top conductive elements, a third mask may be applied to the bottom metal layer. For forming vias, the conductive elements extend into the holes to line the holes with conductive material.

Other conductive elements may also be formed on the bottom metal layer. A second metal is added to the first conductive elements and portions of the bottom metal layer not covered by the second top coat mask to form the bottom conductive elements. Alternatively, the first metal may be added to the top and bottom sides of the assembly without applying a third mask to the bottom metal layer. The first metal is added to the assembly, except in regions protected by the first and second top coat masks.

The purpose of the third mask is to leave only a thin layer of copper on the bottom layer. When the second metal is added, the bottom conductive elements formed thereby are comprised of a greater amount of second metal. The second metal may be a more readily bondable metal than the first metal so that the bottom conductive elements may comprise bonding pads for the connection component.

After adding the second metal, the first and second top coat masks are removed to expose portions of the top and bottom metal layers which are not covered by the top and bottom conductive elements. The exposed portions of the top and bottom metal layers are then removed.

The first and second top coat masks may be removed before the second metal is added. Also before adding the second metal, the bottom metal layer and the portions of the top metal layer not covered by the top conductive elements are removed. The second metal may then be added to build up a coating of second metal on top of the first metal.

BRIEF DESCRIPTION OF THE DRAWINGS

These and other features, aspects, and advantages of the present invention will become better understood with regard to the following description, appended claims and accompanying drawings where:

DETAILED DESCRIPTION OF THE PREFERRED EMBODIMENT

Figure 1:
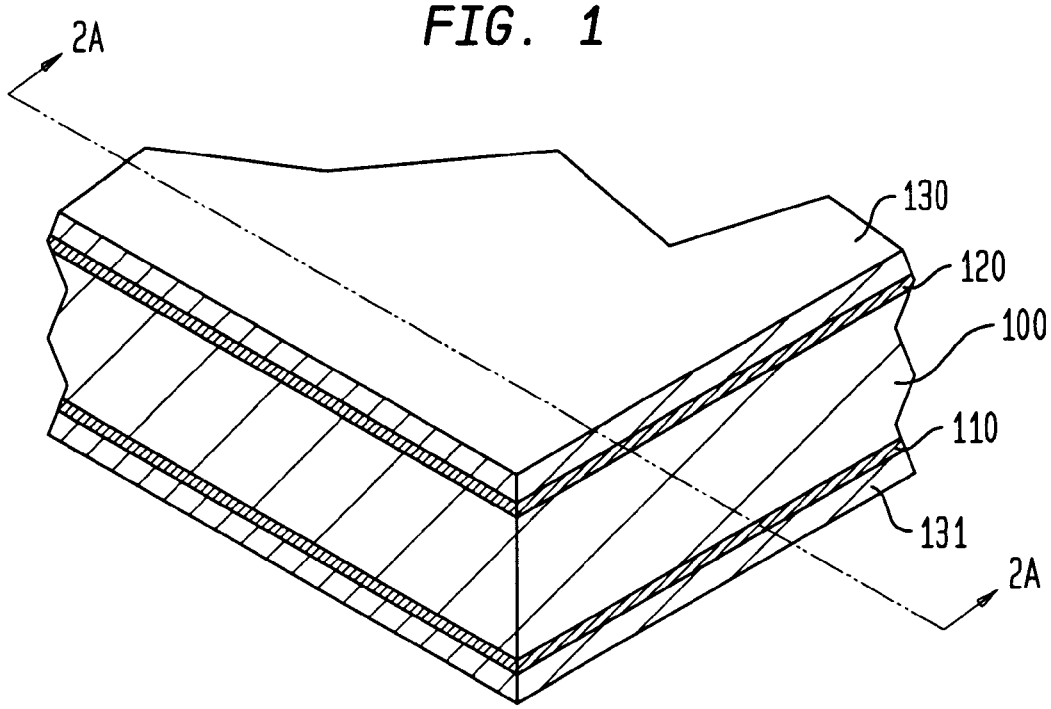
FIG. 1 is a fragmentary, diagrammatic top perspective view of an assembly used in a method in accordance with one embodiment of the invention.
Figure 2A:
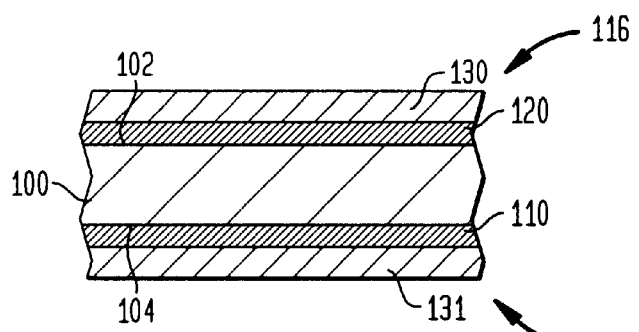
FIG. 2A is a section taken along line 2A—2A of the assembly in FIG. 1.
Figure 2B:
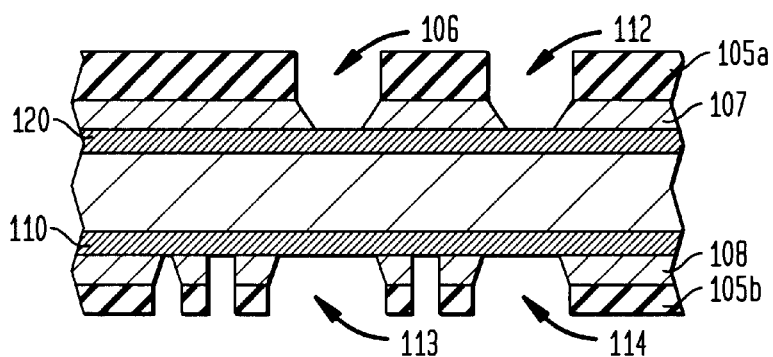
FIG. 2B is a sectional, diagrammatic view of the assembly of FIGS. 1–2A at a later stage in the method.
Figure 2C:
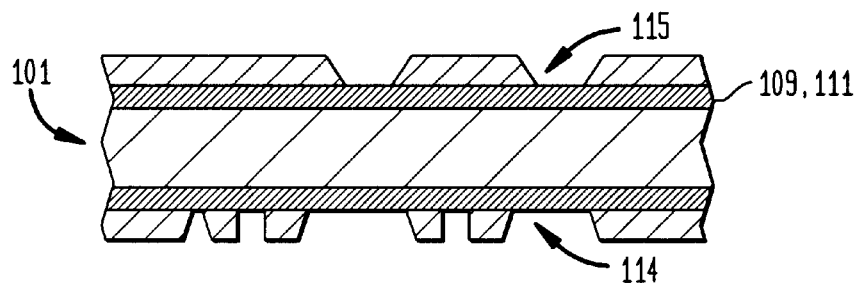
FIG. 2C is a sectional, diagrammatic view of the assembly of FIGS. 1–2B at a later stage in the method.
Figure 2D:
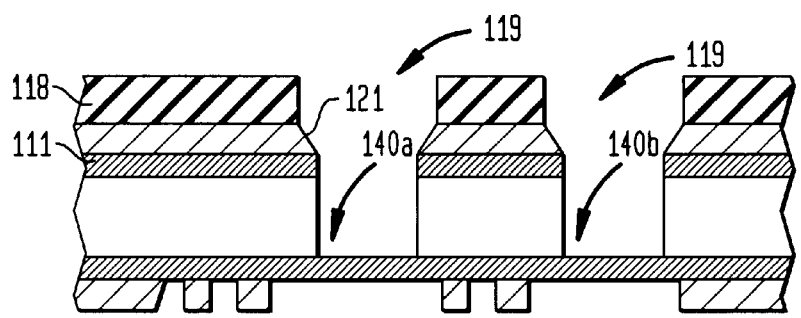
FIG. 2D is a sectional, diagrammatic view of the assembly of FIGS. 1–2C at a later stage in the method.
Figure 2E:
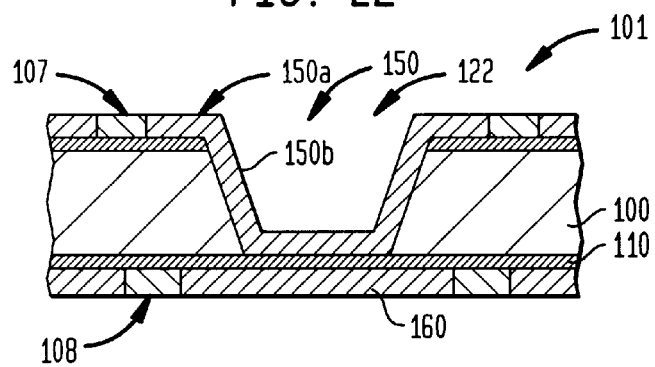
FIG. 2E is a sectional, diagrammatic view of the assembly of FIGS. 1–2D at a later stage in the method.
Figure 2F:
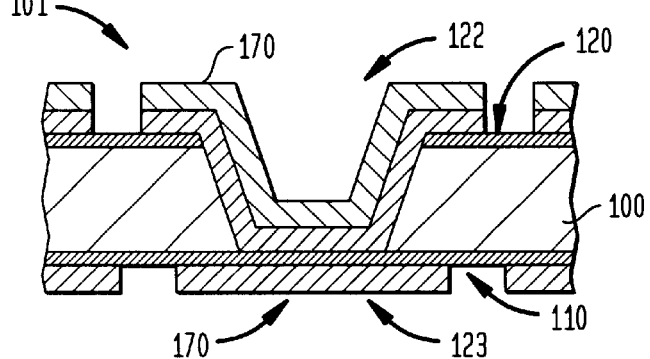
FIG. 2F is a sectional, diagrammatic view of the assembly of FIGS. 1–2E at a later stage in the method.
Figure 2G:
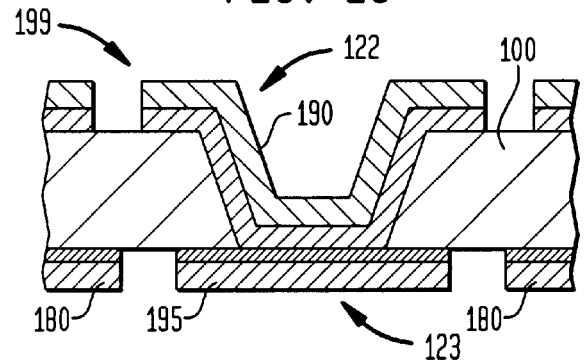
FIG. 2G is a sectional, diagrammatic view of the assembly of FIGS. 1–2F at a later stage in the method.

One embodiment of the invention is shown in FIGS. 1 through 2G. As depicted in FIG. 2A, an assembly comprising a base layer 100 of a dielectric material having a top surface 102 and a bottom surface 104, a top metal layer 120 on the top surface 102, a bottom metal layer 110 on the bottom surface 104, a first top coat 130 of dielectric material on the top metal layer 120 and a second top coat 131 of dielectric material on the bottom metal layer 110 is provided for making a connection component 199 (see FIG. 2G). As depicted in FIG. 2B, after providing the assembly 101, a top plasma-resistive mask 105a and a bottom plasma-resistive mask 105b are used to form openings 106 in the first top coat layer 130 and openings 113 in the second top coat layer 131 by plasma etching the first and second top coat layers to produce a first top coat mask 107 and second top coat mask 108. The first and second top coat masks will be used to form conductive elements such as leads, metal masks and other elements.

The assembly 101 shown in FIG. 2A includes a base layer 100 which is comprised of dielectric material such as polyimide. Preferably, the base layer is comprised of a flexible, substantially inextensible polyimide. The base layer is typically the 25 to 75 microns.

The top metal layer 120 is attached to the top surface 102 of the base layer 100 and the bottom metal layer 110 is attached to the bottom surface 104 of the base layer. Such top and bottom metal layers may be formed, for example, using sputtering, vapor deposition and/or electroplating techniques and typically have a thickness of approximately 2 to 35 microns. The metallic material comprising the top and bottom metal layers is a first metal. The first metal may be comprised of one or more metals. In preferred embodiments, the first metallic material is comprised of copper, nickel or alloys thereof. The first metal material of the top metal layer may be the same or different than the first metal of the bottom metal layer. The first metal may be the same as or different than the second metal discussed below. Most preferably, the metal layers are applied to the base layer 100 by applying a thin layer of the first metal by sputtering or vapor deposition to the base layer, then electroplating additional metal onto the thin layer to build up the desired thickness. The assembly may also include tie coat, a barrier layer and/or an adhesive layer between the base layer and each of the metal layers. Any electrically conductive metal can be used as the top and bottom the metal layers. The first metallic material of the top metal layer may be the same or different than the first metallic material of the bottom metal layer. In the embodiment of FIGS. 2A through 2H, the top metal layer 120 and bottom metal layer 110 comprise layers of copper or copper-rich alloys.

The assembly 101 shown in FIG. 1 has a first top coat 130 on a top side 116 of the assembly and a second top coat 131 on a bottom side 117 of the assembly. The top coats comprise a plasma etchable dielectric material, such as a coating of a polyimide or another polymeric material.

The top coats may be applied, for example, by spraying, dipping, electrophoretic coating, spin coating, lamination, curtain coating, or roller coating. The dielectric material used as the first top coat 130 and second top coat 131 is a plasma etchable material and resistant to the chemical etchant used in subsequent steps of the process as discussed below. The flexible, substantially inextensible polyimide for the base layer discussed above may be used as the top coats.

As depicted in FIG. 2B, the first and second top coats are patterned to form a first top coat mask 107 and a second top coat mask 108. Such patterning is accomplished using a top plasma-resistive mask 105a and a bottom plasma-resistive mask 105b. Top plasma-resistive mask 105a and bottom plasma-resistive mask 105b are attached to, or disposed on, the first top coat layer 130 and to the second top coat layer 131, respectively. The top plasma-resistive mask 105a has openings 112 and the bottom plasma-resistive mask 105b has openings 113. Dielectric material aligned with openings 112 is removed from top coat 130 and dielectric material aligned with openings 113 is removed from topcoat 131, to form a top coat mask 107 and bottom coat mask 108. The plasma etching process creates openings 106 in the first top coat 130 and thereby forms a first top coat mask 107. The plasma etching process also creates openings 114 formed in the second top coat 131 and thereby forms a second top coat mask 108.

In the plasma etching process, the assembly 101 is placed within a plasma treatment chamber and a plasma is formed at a subatmospheric pressure by an electrical discharge between a pair of electrodes disposed within the chamber, or between an electrode and a conductive wall of the chamber. Chemically reactive species formed within the plasma attack the polymeric material of the first top coat 130 and bottom top coat 131, forming holes or openings in these layers.

The plasma treatment chamber includes a conventional vacuum pump and an associated conventional control system for maintaining a subatmospheric pressure and a gas source. The gas source supplies a gas mixture to the chamber. The gas source includes a plasma-forming gas, desirably including a halogen containing gas such as a lower halogenated hydrocarbon such as, for example, tetrafluoromethane. The gas source may also include oxygen and a carrier gas, desirably an inert gas such as argon. The plasma-forming gas typically includes about 10–30% $CF_4$ and about 10–30% $O_2$, the remainder being comprised of carrier gas.

The plasma treatment chamber includes a pair of electrodes, one of which is grounded. Typically, the chamber wall is utilized as part or all of the grounding electrode. An alternating potential source connected to the electrodes provides an alternating potential at a radio frequency. The electrical potential converts the gas to a plasma which includes highly reactive species capable of etching the polymeric material of first and second top coat layers 130 and 131.

The plasma-resistive masks 105a and 105b shown in FIG. 2B are comprised of a material which is resistive to the plasma etchant. For example, if the plasma-etchant is generated by O2CF4, the plasma-resistive mask 105a and the solid mask may be comprised of a material such as, for example, molybdenum, beryllium copper, Invar, copper-invar-copper, etc. In preferred embodiments, the plasma-resistive mask is comprised of a material having a low CTE in order to minimize registration and alignment problems upon exposure to elevated or reduced temperatures. The solid mask may be attached to one of the top coat layers using, for example, a tacky substance or an adhesive material. The plasma-resistive masks are preferably attached to the top coat layers so that there are virtually no gaps between the top coat layers and the plasma-resistive masks because the plasma etching tends to be substantially isotropic. FIG. 2B illustrates the assembly after the plasma etching of the first top coat 130 and second top coat 131. After plasma-etching both sides of the assembly through masks 105a and 105b, the masks 105a and 105b are removed.

The top coat masks are not removed from the assembly, but remain to define areas on which conductive elements will be formed. The top coat mask 107 is used to remove metal from portions of top metal layer 120 to provide openings 115 aligned with openings 106 in the top coat mask 107. The portions of the top metal layer 120 which remain form conductive elements 109 comprising a metal mask 111. To remove the undesired portions of top metal layer 120, the top side 116 of the assembly 101 is etched. To etch the copper layer 120, an etchant such as, for example, HCl/CuCl solutions, sodium persulfate/sulfuric acid solutions, an ammonical copper etchants, ferric chloride or hydrogen peroxide/sulfuric acid solutions may be employed. Openings 115 leave portions of base layer 100 partially exposed. After this step, the assembly 101 resembles the schematic cross-section provided in FIG. 2C.

Vias and bond windows are preferably formed in the assembly 101 by forming holes 140 in the base layer 100 using plasma etching on one side of the assembly 101 through another mask 118. The holes may be formed by using various etching methods, but plasma etching, laser etching chemical etching are preferred. If plasma etching is used, mask 118 is also a plasma-resistive mask similar to masks 105a and 105b. The mask is applied to the first top coat mask 107 so that openings 119 in the other mask 118 are substantially aligned with openings 115 in metal mask 111. Holes 140a for vias and holes 140b for bond windows may be formed. The plasma etching process is continued until via holes and bond window holes extend through base layer 100 to expose portions of bottom metal layer 110 from the top side 116 of the assembly 101. At this stage, the assembly 101 is shown schematically in section in FIG. 2D. The other mask 118 is removed from the assembly 101. Alternatively, no mask 118 is used and copper under the top coat layer defines holes and all of the top coat is simultaneously removed.

Most preferably, openings 119 are slightly larger than openings 115. This facilitates the forming of vias and bond windows 140 and allows the alignment tolerance of the mask 118 to mask 111 to be somewhat larger. Because openings 119 are slightly larger than openings 115, portions of the first top coat mask 107 will be etched. This will expose regions 121 on the metal mask 111. These exposed regions 121 of mask 111 will provide a surface for forming top conductive elements 122.

Figure 8:
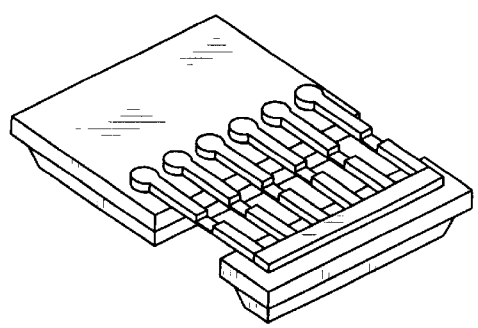
FIG. 8 is a top perspective view of a connection component made in accordance with a further embodiment of the invention.

Conductive elements are now formed on regions 121 and extending into the via holes 140a, if a bond window is present. Although FIGS. 2E through 2H show only the via being formed, if a bond window is present, a blocker may be used to shield the bond windows 140b while further steps are performed. A bond window having leads extending across the window is illustrated in FIG. 8. Conductive material, such as copper and copper-rich alloys are deposited on regions 121 and lining the via holes. First, a seed material is deposited in the via holes to line the dielectric material with a conductive material by sputter coating or evaporating the dielectric material through a mask, or through other methods, such as, for example, wet chemical deposition. The seed material enables the electroplating of the dielectric material lining the via holes 140A with copper, gold or another metal.

A photoresist 160 is applied to the bottom side 117 of the assembly to shield the bottom metal layer 110. Then, the top conductive material comprising a first metal, is copper plated onto the conductive surfaces defined by the first top coat mask 107 to create top conductive elements 122. The first metal is preferably copper or a copper-based alloy. Elements 122 may comprise conductive vias 150 having pads 150A concentric with via liners 150B. The pads 150A extend on the regions 121 on metal mask 111. All of the photoresist 160 is then removed from the assembly 101.

A second metal is added to the exposed conductive material of the assembly, defined by the first and second top coat masks. Second metal 170 may comprise gold or a gold-based alloy, copper, or a copper-based alloy, or composites of these metals. Preferably, the second metal comprises a metallic material which is different from the first metal of top metal layer 120 and bottom layer 110 so that the second metal is not etched, or much more slowly etched by etchants which etch the first metal. If the metal layers 110 and 120 are comprised of copper or copper-based alloys, then gold or gold-based alloys are preferably used as second metal 170. Differential rectification electroplating may be used if differing thicknesses of second metal 170 are desired. The first and second top coats are removed by plasma or chemical etching the top and bottom sides of the assembly. FIG. 2F shows the assembly 101 after second metal 170 is added and second top coat masks are removed.

Figure 2H:
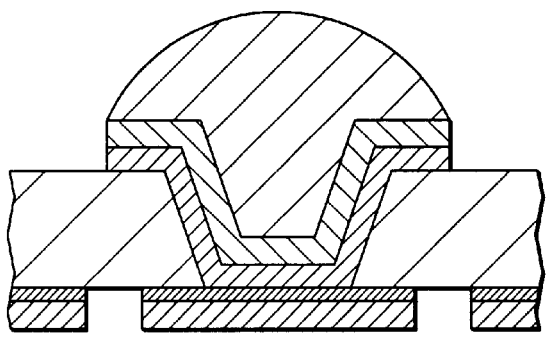
FIG. 2H is a sectional, diagrammatic view of the assembly of FIGS. 1–2G at a later stage in the method.

Both sides of assembly 101 are flash etched to remove the relatively thin layers of metal 110 and 120. These layers may be removed entirely from the assembly 101 because they are relatively thin as compared to the second metal or because they are etched by an etching solution which does not affect second metal 170. After the flash copper layers are removed, the connection component 199 shown in FIG. 2G is complete, having vias 190 to connect conductive elements or leads on one surface of the base layer 100 with conductive elements or leads adjacent the other surface. Some of the bottom conductive elements 123 comprise lands 195 which are relatively large compared to via holes 140a. This provides some structural stability to the vias 190 and promotes adherence of the via liners 150 to the dielectric material of the base layer 100. Such lands can also serve as assembly pads, for example, solder balls. The connection component or assembly 199 may be subjected to further steps to form additional leads, additional layers for the assembly, or other conductive elements. For example, a ball grid array may be formed by adding additional metal or conductive material such as solder to the vias so that the solder wets to pad 150A. Such a solder ball for a grid array is shown in FIG. 2H.

Figure 3A:
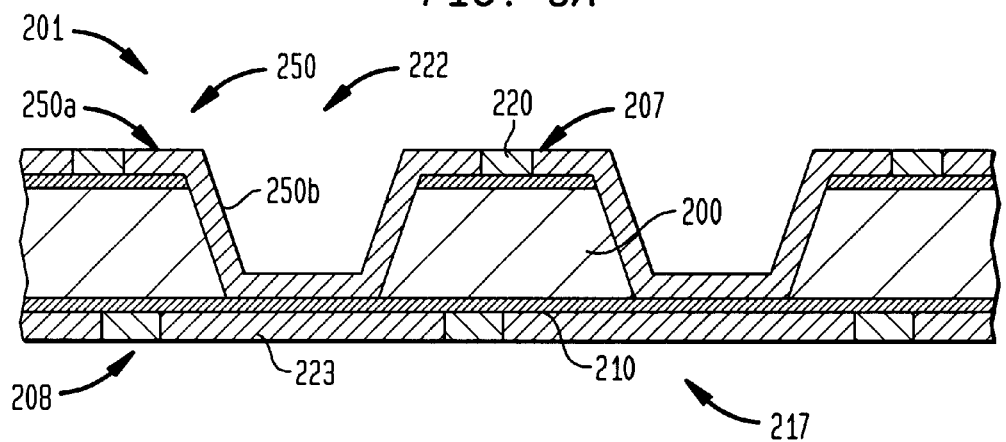
FIG. 3A is a sectional, diagrammatic view of an assembly during a method in accordance with another embodiment of the invention.
Figure 3B:
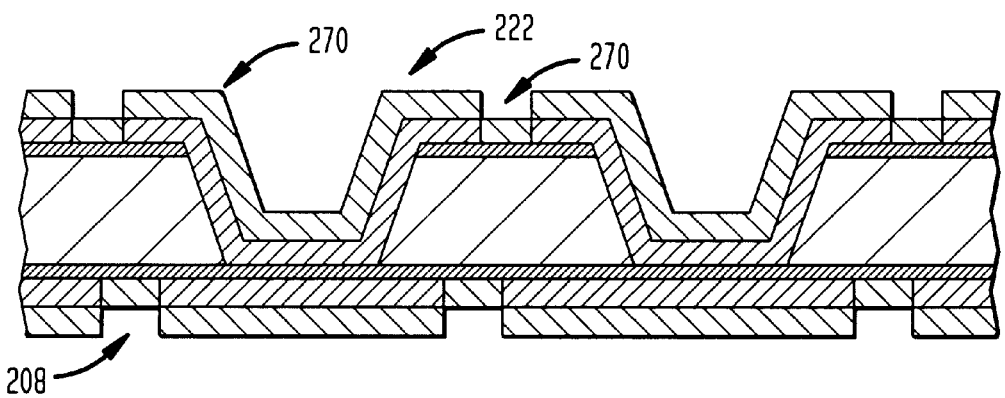
FIG. 3B is a sectional, diagrammatic view of the assembly of FIG. 3A at a later stage in the method.

The non-photographically patterned mask can be used in making other connection components. For example, in an embodiment in which top conductive elements 222 of first metal are added to an assembly 201, no resist is applied to the bottom metal layer 210, leaving portions of the bottom metal layer 210 uncovered. These uncovered portions are defined by the second top coat mask 208. FIG. 3A shows the assembly 201 at the same stage in the process as FIG. 2E. FIG. 3A shows top conductive elements 222 and bottom conductive elements 223 formed on the top side 216 and bottom side 217 of the assembly 201, respectively. In FIG. 3B, the next step is illustrated. Second metal 270 is plated on the top side 216 and the bottom side 217 to add the second metal to the top conductive elements 222 and bottom conductive elements 223. The first and second top coat masks are removed by plasma etching and the portions of the top metal layer 220 and bottom metal layer 210 which were covered by the first and second top coat masks are etched to remove them from the assembly and leave separate conductive elements on the top side 216 and bottom side 217 of the assembly 201. This embodiment of the invention may be used to form bottom conductive elements 223 comprising more copper as compared to the bottom conductive elements 123 of FIG. 2G. The bottom conductive elements of FIG. 2G includes a greater proportion of gold to facilitate bonding so that the bottom side 117 includes bonding pads for the connection component. Using the bonding pads, the connection components may be connected to other elements of an electronic device.

Figure 4A:
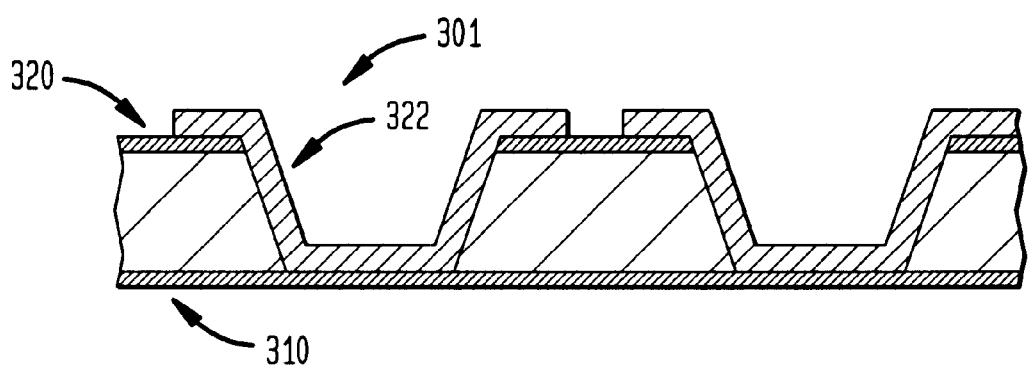
FIG. 4A is a sectional, diagrammatic view of an assembly during a method in accordance with yet another embodiment of the invention.
Figure 4B:
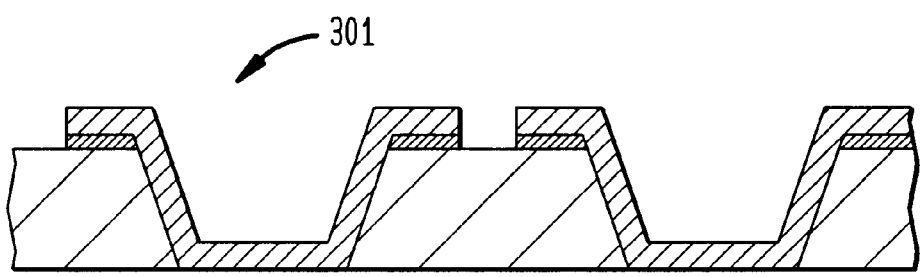
FIG. 4B is a sectional, diagrammatic view of the assembly of FIG. 4A at a later stage in the method.
Figure 4C:
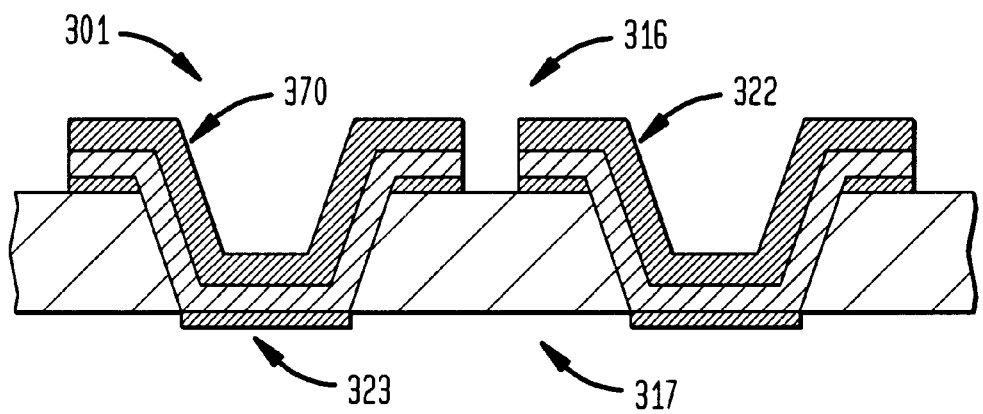
FIG. 4C is a sectional, diagrammatic view of the assembly of FIGS. 4A–4B at a later stage in the method.

In another embodiment of the invention, the first and second top coat masks may be removed before the application of the second metal to the assembly. Thus, in FIG. 4A the assembly 301 is shown at the same stage in the process as in FIG. 2E. A first top coat mask has been used to define elements 322 and has been removed to expose portions of top metal layer 320. Bottom metal layer 310 is entirely exposed. The third mask 160 shown in FIG. 2E has been removed. It is desirable that the copper layers are 2 to 7 microns in thickness, and most preferably thinner. The next step is shown in FIG. 4B in which the exposed portions of top metal layer 320 and bottom metal layer 310 have been flash etched to remove them from the assembly 301. FIG. 4C shows the assembly 301 after second metal 370 is plated onto the exposed metal regions of the top side 316 and bottom side 317 of the assembly 301 to form top conductive elements 322 and bottom conductive elements 323. An electrolytic plating process may be used to add second metal 370. However, the electrolytic process will not achieve as good conformal plating of the circuit features as an immersion plating process. Thus, an immersion plating process is preferred for adding the second metal 370 on to the exposed metal regions.

Figure 5A:
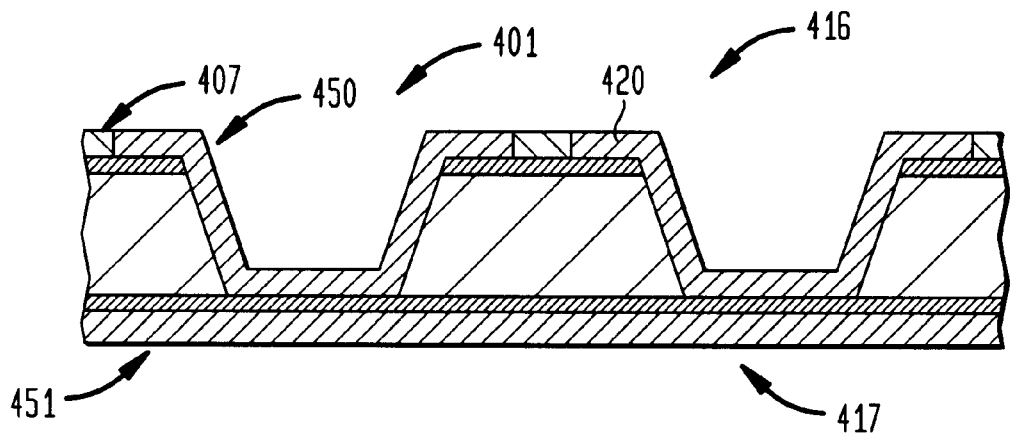
FIG. 5A is a sectional, diagrammatic view of an assembly during a method in accordance with yet another embodiment of the invention.
Figure 5B:
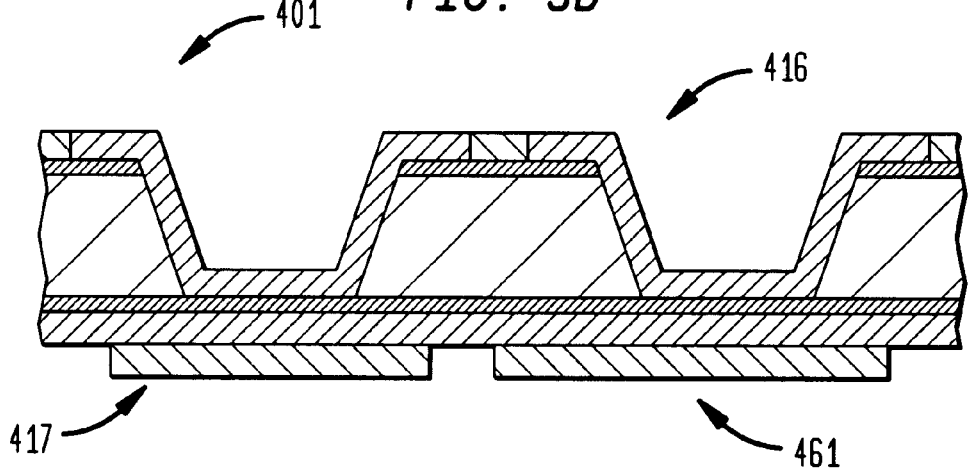
FIG. 5B is a sectional, diagrammatic view of the assembly of FIG. 5A at a later stage in the method.
Figure 5C:
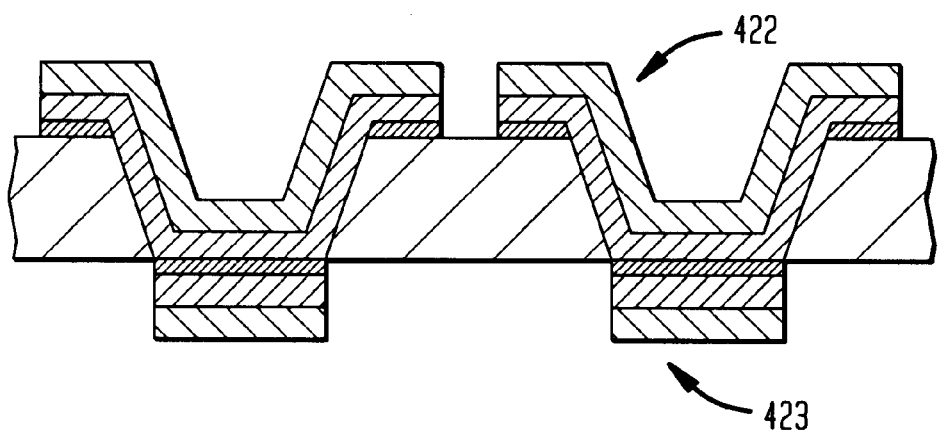
FIG. 5C is a sectional, diagrammatic view of the assembly of FIGS. 5A–5B at a later stage in the method.

Another embodiment of the invention is shown in FIG. 5A, which illustrates the assembly 401 at the same stage in the process as FIG. 2E. Metal layer 450 is plated onto the exposed regions of conductive material defined by top coat mask 407. A metal layer 451 is plated on to the bottom side 417 of the assembly. The layer 450 is a relatively thin layer of about 2 to 7 microns and the layer 451 on the bottom side is a relatively thick layer of 10 to 7 microns. A subtractive process is then applied to the bottom side 417 to form the bottom conductive elements 423. Thus, in FIG. 5B a mask of photoresist 461 has been photographically patterned on layer 451. The bottom side 417 is etched to form conductive elements 423 on the bottom of the assembly 401. Next, second metal 170 is applied to the top and bottom sides of the assembly 401. The first top coat mask 407 is removed and the top metal layer 420 is flash etched to provide the connection component shown in FIG. 5C. In all of the above-discussed Figures, the proportions of the connection components may be exaggerated to clearly show the layers of metal comprising the elements.

Figure 6A:
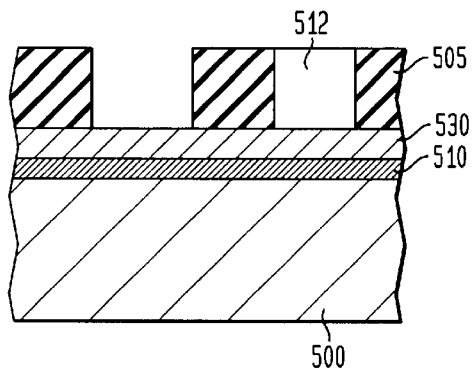
FIG. 6A is a sectional, diagrammatic view of an assembly during a method in accordance with yet another embodiment of the invention.
Figure 6B:
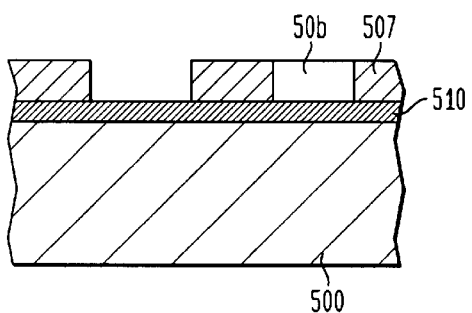
FIG. 6B is a sectional, diagrammatic view of the assembly of FIG. 6A at a later stage in the method.
Figure 6C:
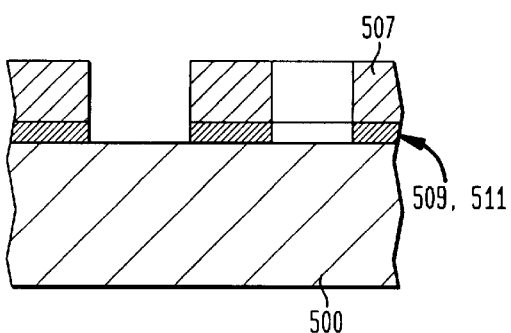
FIG. 6C is a sectional, diagrammatic view of the assembly of FIGS. 6A–6B at a later stage in the method.

In the above-discussed embodiments, vias, bond windows, or other apertures in the base layer are formed and conductive elements are formed on a top and a bottom side of the base layer. In further embodiments of the invention, a base layer having conductive elements on one side may be formed using a non-photographically patterned mask to form conductive elements on one side of the base layer. Thus, in FIG. 6A an assembly 501 is provided comprising a base layer 500, a metal layer 510 overlying a top surface 502 of the base layer 500 and a top coat 530 overlying the metal layer. A plasma resistive mask 505 is applied to the top coat 530. Openings 512 in the mask 505 are used to form the top coat mask 507 shown in FIG. 6B. The top coat mask 507 has openings 506 which are used to form conductive elements 509 shown in FIG. 6C by etching the metal layer 510 to remove metal from regions of the metal layer 510 aligned with openings 506. Conductive elements 509 may comprise a metal mask 511, similar to the metal mask 111 in FIG. 2C. Using the metal mask openings may be formed in the base layer 500 as discussed above to form vias or bond windows.

Figure 7A:
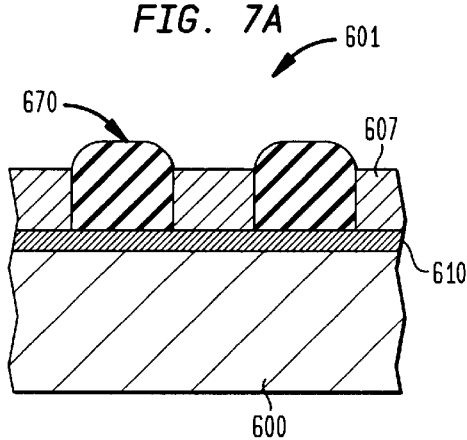
FIG. 7A is a sectional, diagrammatic view of an assembly during a method in accordance with yet another embodiment of the invention.
Figure 7B:
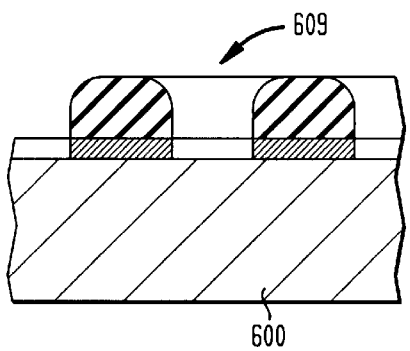
FIG. 7B is a sectional, diagrammatic view of the assembly of FIG. 7A at a later stage in the method.

Alternatively, and as shown in FIG. 7A, the top coat mask 607 may be used to form conductive elements 609 by adding a second metal 670 on regions of metal layer 610 not covered by top coat mask 607. After removing the top coat mask 607, the assembly 601 is etched to remove portions of the metal layer 610 not covered by second metal 670 to provide the connection component shown in FIG. 7B.

The processes discussed above illustrate the use of the invention to form connection components which may include connection components for microelectronic devices, circuit boards, other electronic applications, or metallic components for non-electronic applications. Although the present invention has been described in considerable detail with reference to certain preferred examples thereof, other versions are possible. Therefore, the spirit and scope of the appended claims should not be limited to the description of the preferred examples discussed above.

What is claimed is:

1. A method of making a connection component for a semiconductor chip package, said method comprising the steps of:

providing a base layer of a dielectric material for the connection component, a metal layer overlying the base layer, and a top layer of a plasma etchable material overlying the metal layer;

forming openings in the top layer using plasma etching to produce a top layer mask; and forming first conductive elements for the connection component from the metal layer by utilizing the top layer mask as a mask while removing metal from regions of the metal layer aligned with the openings in the top layer mask.

2. The method of claim 1, wherein the openings in the top layer are formed using a plasma-resistive mask.

3. The method of claim 2, wherein the plasma etchable material comprises a plasma etchable dielectric material.

4. The connection component made using the process of claim 1.

5. A method of making a connection component for a semiconductor chip package, said method comprising the steps of:
   providing an assembly comprising a base layer of a dielectric material, a metal layer overlying the base layer, and a top layer of a plasma etchable material overlying the metal layer;
   forming openings in the top layer using plasma etching to produce a top layer mask;
   forming conductive elements on the metal layer by adding a conductive material to regions of the metal layer aligned with the openings in the top layer mask;
   removing the top layer mask; and
   removing metal from regions of the metal layer not aligned with the conductive material.

6. The method of claim 3, wherein the metal layer comprises a first metallic material and the added metal comprises a second metallic material different from the first metallic material.

7. The method of claim 6, wherein the removing metal step is comprised of the step of exposing the metal layer to an etching agent which more readily etches the first metallic material than the second metallic material.

8. A method of making a connection component for a semiconductor chip package, said method comprising the steps of:
   providing an assembly comprising a base layer of a dielectric material, a metal layer overlying the base layer, and a top layer of a plasma etchable material overlying the metal layer;
   forming openings in the top layer using plasma etching to produce a top layer mask; and
   forming first conductive elements from the metal layer by utilizing the top layer mask as a mask while removing metal from regions of the metal layer aligned with the openings in the top layer mask;
   further comprising the step of forming one or more holes in the base layer using the first conductive elements as a metal mask.

9. The method of claim 8, wherein said hole-forming step comprises applying another mask to the top layer mask, the other mask having openings aligned with the openings in the top layer mask and etching the base layer until the holes are formed, and removing the other mask.

10. The method of claim 9, wherein the other mask has openings slightly larger than the openings in the top layer mask so that the top layer mask is also etched to expose regions on the first conductive elements on which second conductive elements will be formed.

11. The method of claim 10, comprising forming the second conductive elements by adding a layer of a first metal on the regions.

12. The method of claim 11, comprising forming one or more leads extending across the one or more holes.

13. The method of claim 11, wherein the second conductive elements also extend into the one or more holes.

14. The method of claim 13, comprising adding a second metal to the first metal of the second conductive elements.

15. The method of claim 14, comprising removing the top layer mask.

16. The method of claim 15, comprising removing the first conductive elements, except for the regions.

17. The method of claim 8, wherein the metal layer comprises a top metal layer on a top surface of the base layer and further comprising a bottom metal layer on a bottom surface of the base layer.

18. The method of claim 17, further comprising forming second conductive elements by adding a layer of metal in the openings of the top layer mask and in the holes.

19. A method of making a connection component having conductive elements formed thereon, comprising:
   providing an assembly comprising a base layer of a dielectric material having a top surface and a bottom surface, a top metal layer on the top surface, a bottom metal layer on the bottom surface, a first top layer of a plasma-etchable material on the top metal layer, and a second top layer of plasma-etchable material on the bottom metal layer;
   forming openings in the first and second top layers to produce a first top layer mask and a second top layer mask; and
   forming conductive elements from the top metal layer, the bottom metal layer, or both by removing metal from regions aligned with openings in the first top layer mask, the second top layer mask, or both.

20. The claim 19, wherein openings in the first and second top layers are formed using a plasma-resistive mask and the first and second top layer masks are formed by plasma etching the first and second top layer through the plasma-resistive mask.

21. The method of claim 20, wherein the plasma-etchable material comprises a plasma-etchable dielectric material.

22. The method claim 21, comprising using the first and second top layer masks to form a top and a bottom metal mask by removing metal from the top metal layer, the bottom metal layer, or both, and forming holes in the base layer using the top and bottom metal masks.

23. The method of claim 21, comprising using the first top layer mask to form a metal mask from the top metal layer by removing metal from the top metal layer, using a second mask to form holes in the base layer, and removing the second mask.

24. The method of claim 23, comprising removing dielectric material from the first top layer mask during the hole-forming step to expose regions on the top metal mask on which top conductive elements will be formed and removing the second mask.

25. The method of claim 23, comprising using the top layer mask to form top conductive elements by adding a first metal to the assembly.

26. The method of claim 25, wherein the top conductive elements extend in the holes.

27. The method of claim 25, comprising applying a third mask to the bottom metal layer before forming the top conductive elements.

28. The method of claim 27, comprising removing the third mask and adding a second metal to the top conductive elements and the portions of the bottom metal layer not covered by the second top layer mask to form bottom conductive elements.

29. The method of claim 25, comprising adding a second metal to the top conductive elements and portions of the bottom metal layer not covered by the second top layer mask to form bottom conductive elements.

30. The method of claim 28, comprising removing the first and second top layer masks to expose portions of the top and bottom metal layers not covered by the top and bottom conductive elements and removing the exposed portions of the top and bottom metal layers.

31. The method of claim 29, comprising removing the first and second top layer masks to expose portions of the top and bottom metal layers not covered by the top and bottom conductive elements and removing the exposed portions of the top and bottom metal layers.

32. The connection component made using the process of claim 19.

33. The method of claim 21, wherein first conductive elements are formed from the top metal layer and second conductive elements are formed from the bottom metal layer.

34. The method of claim 33, further comprising forming holes in the base layer aligned with the openings in the first top layer mask.

35. A method of making a connection component having conductive elements formed thereon, comprising:

providing an assembly comprising a base layer of a dielectric material having a top surface and a bottom surface, a top metal layer on the top surface, a bottom metal layer on the bottom surface, a first top layer of a plasma-etchable material on the top metal layer, and a second top layer of plasma-etchable material on the bottom metal layer;

forming openings in the first and second top layers to produce a first top layer mask and a second top layer mask, the step of forming openings including plasma etching the first and second top layers through plasma-resistive masks;

forming first conductive elements from the top metal layer, by removing metal from regions aligned with openings in the first top layer mask;

forming holes in the base layer aligned with the openings in the first top layer mask; and adding a layer of metal in the openings of the first top layer mask and in the holes.

36. A method of making a connection component having conductive elements formed thereon, comprising:

providing an assembly comprising a base layer of a dielectric material having a top surface and a bottom surface, a top metal layer on the top surface, a bottom metal layer on the bottom surface, a first top layer of a plasma-etchable material on the top metal layer, and a second top layer of plasma-etchable material on the bottom metal layer;

forming openings in the first and second top layers to produce a first top layer mask and a second top layer mask, the step of forming openings including plasma etching the first and second top layers through plasma-resistive masks; and forming second conductive elements from the bottom metal layer, by
adding metal in the openings of the second top layer mask and removing metal from regions of the bottom metal layer.

* * * * *

UNITED STATES PATENT AND TRADEMARK OFFICE
CERTIFICATE OF CORRECTION

PATENT NO.    : 6,518,160 B1
DATED         : February 11, 2003
INVENTOR(S)   : Joseph Fjelstad, Belgacem Haba and David Light It is certified that error appears in the above-identified patent and that said Letters Patent is hereby corrected as shown below:

Column 1,
Line 66, "has a poor" should read -- has poor --.

Column 2,
Line 3, "futhermore are" should read -- futhermore, are --.

Column 3,
Line 32, "bondable then" should read -- bondable than --.

Column 5,
Line 61, "typically the 25" should read -- typically 25 --.

Column 6,
Line 18, "bottom the" should read -- bottom of the --.
Line 48, "topcoat 131" should read -- top coat 131 --.

Column 8,
Line 33, "metal, is" should read -- metal is --.

Column 9,
Line 38, "includes a greater" should read -- included a greater --.

Column 11,
Line 25, "claim 3" should read -- claim 5 --.

Column 12,
Line 28, "The claim 19" should read -- The method of claim 19 --.
Line 31, "top layer" should read -- top layers --.
Line 35, "The method claim 21" should read -- The method of claim 21 --.

UNITED STATES PATENT AND TRADEMARK OFFICE
CERTIFICATE OF CORRECTION

PATENT NO. : 6,518,160 B1
DATED : February 11, 2003
INVENTOR(S) : Joseph Fjelstad, Belgacem Haba and David Light It is certified that error appears in the above-identified patent and that said Letters Patent is hereby corrected as shown below:

<u>Column 14,</u>
Line 23, "layer, by" should read -- layer, including --.
Lines 25-26, "mask and removing metal from regions of the bottom metal layer." should read -- mask. --.

Signed and Sealed this

Twenty-ninth Day of July, 2003

JAMES E. ROGAN
*Director of the United States Patent and Trademark Office*